(12) United States Patent
Toda

(10) Patent No.: US 6,299,722 B1
(45) Date of Patent: Oct. 9, 2001

(54) ETCHING EQUIPMENT INCLUDING A POST PROCESSING APPARATUS FOR REMOVING A RESIST FILM, POLYMER, AND IMPURITY LAYER FROM AN OBJECT

(75) Inventor: Akihito Toda, Yamanashi-ken (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 08/478,814

(22) Filed: Jun. 7, 1995

Related U.S. Application Data

(62) Division of application No. 08/167,046, filed on Dec. 16, 1993, now abandoned.

(30) Foreign Application Priority Data

Dec. 16, 1992 (JP) .................................................... 4-354410

(51) Int. Cl.[7] .............................. C23F 1/02; G01L 21/30; C23C 16/00
(52) U.S. Cl. .............................. 156/345; 216/59; 216/60; 118/715
(58) Field of Search ................................ 156/345, 626.1; 216/59, 60; 118/715

(56) References Cited

U.S. PATENT DOCUMENTS

| | | | |
|---|---|---|---|
| 4,345,968 | * | 8/1982 | Coe ........................................ 156/345 |
| 4,479,848 | * | 10/1984 | Otsubo et al. ......................... 156/345 |
| 5,014,217 | * | 5/1991 | Savage ..................................... 216/60 |
| 5,164,034 | * | 11/1992 | Arai et al. .............................. 156/345 |
| 5,186,120 | * | 2/1993 | Ohnishi ................................. 118/715 |
| 5,344,542 | * | 9/1994 | Maher et al. ......................... 156/345 |
| 5,376,212 | * | 12/1994 | Saiki ..................................... 156/345 |
| 5,385,624 | * | 1/1995 | Amemiya et al. .................... 156/345 |

* cited by examiner

Primary Examiner—John F. Niebling
Assistant Examiner—Ha Tran Nguyen
(74) Attorney, Agent, or Firm—Oblon, Spivak, McClelland, Maier & Neustadt, P.C.

(57) ABSTRACT

The present invention discloses a method including the main etching step for etching a semiconductor wafer having a resist film serving as an etching mask by plasma of an etching gas, and an post-processing step for processing the object after the main etching so as to remove remaining part of the resist film, a polymer adhered to the surface of the object, and an impurity layer created during the primary etching. In the post-processing step, $O_2$ gas is made into plasma, by which the remaining part of the resist layer, and the polymer adhered to the surface of the object are removed, and after such a process is substantially finished, a mixture gas including a halogen-containing gas such as $CF_4$ and $O_2$ gas is made into plasma, by which the impurity layer is removed.

2 Claims, 4 Drawing Sheets

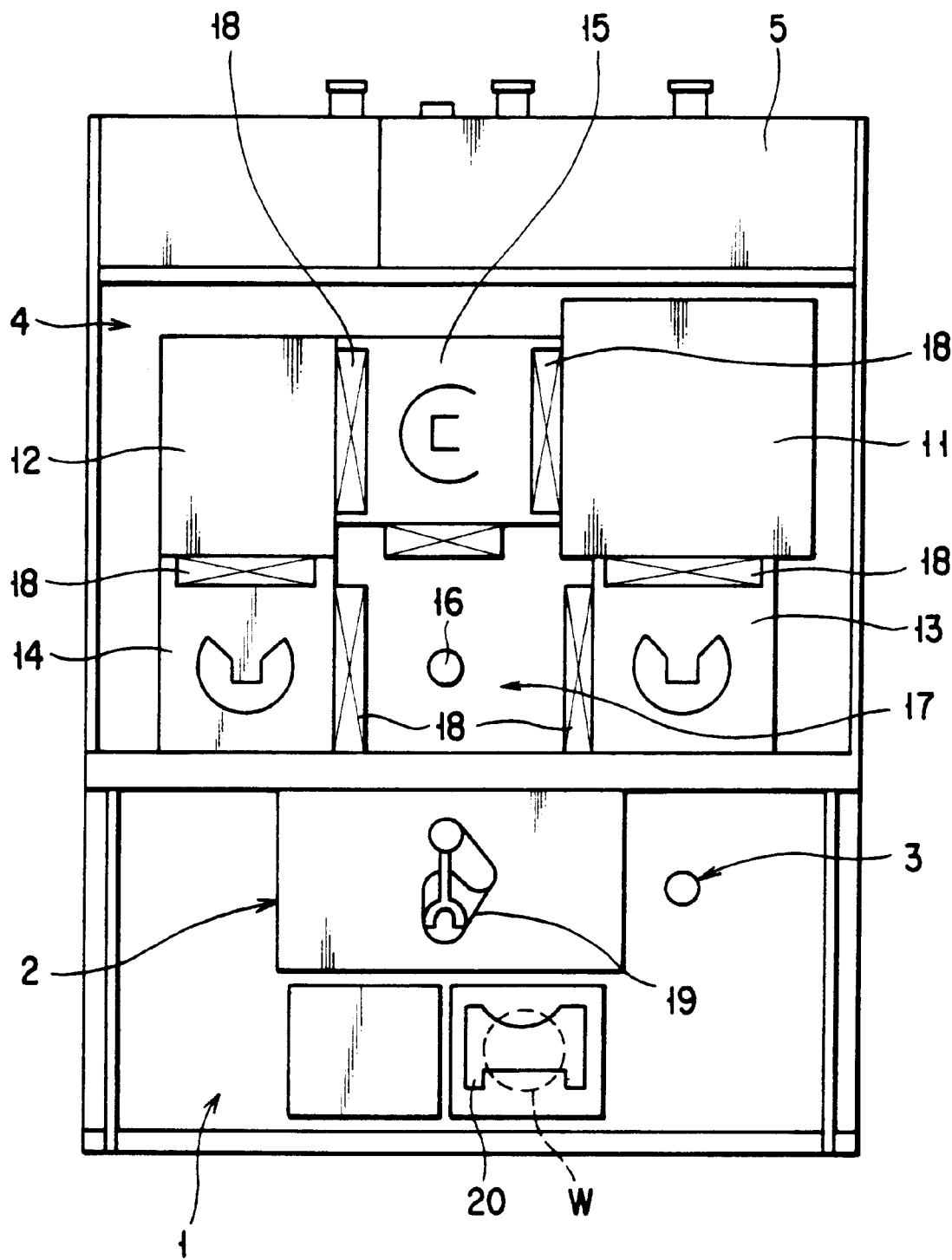
F I G. 1

ETCHING EQUIPMENT INCLUDING A POST PROCESSING APPARATUS FOR REMOVING A RESIST FILM, POLYMER, AND IMPURITY LAYER FROM AN OBJECT

This is a Division, of application Ser. No. 08/167,046 filed on Dec. 16, 1993, abandoned.

BACKGROUND OF THE INVENTION

1. Field of the Invention

The present invention relates to an etching method for an object to be processed such as a semiconductor wafer, and more specifically to an etching method including a post-etching step for eliminating impurities created in an etching step, method of post-etching process and etching equipment.

2. Description of the Related Art

The degree of integration of the integrated circuit, which is the nucleus of the microelectronics, is presently increasing, and in accordance with an increase in the degree of integration, the width of the pattern is reduced, and the depth thereof is increased. In order to comply with this, there has been developed a dry etching method under a high vacuum condition as a thin film processing technique. In the dry etching, plasma is generated by using a reaction gas in a vacuum, and various materials on a semiconductor substrate is etched by ions, neutral radicals, atoms, and molecules in the plasma. In the dry etching, various types of gas can be used, and a type of gas is seized in accordance with a material to be etched. Thus, selection of an etching gas is a very important factor of the dry etching.

In the case where the material of an object to be processed is, for example, silicon (Si), or silicon oxide ($SiO_2$), a fluorine-based (F) or fluorine-hydrogen-based (F—H) etching gas is used. In general, carbon tetrafluoride ($CH_4$) is most commonly used. This is because it is essential in etching of a silicon oxide film that carbon (C) should be present and a great amount of fluorine ion should be generated.

In the etching of a $SiO_2$ film, the most important factor is to raise the selection ratio of etching with respect to its underlying silicon. In order to increase such selection ratio, there has been proposed an addition of hydrogen to an etching gas, and more specifically, trifluoromethane ($CHF_3$) is used as such an etching gas. By use of $CHF_3$, a deposition layer is formed as a cover on the surface of the silicon layer such that the surface of the silicon layer cannot be directly attacked by ions. Consequently, the silicon substrate (wafer) is hardly etched. Also, when attacked by accelerated fluorine ions, the silicon oxide film generates oxygen, by which the polymer formed of C—H on the film can be removed, thereby achieving a sufficient etching process.

During the etching process, a damage layer containing impurities is formed on the bottom of an etching hole. Such a damage layer is removed after the etching process.

The use of $CHF_3$ as the etching gas makes it likely that polymers adhere to the surface of the etched object. Due to the presence of the polymers, it requires a great amount of time in following steps such as ashing and light etching, after completion of the etching process, and the reproducibility of the etching is degraded.

Further, the polymers and resist include the following drawback. That is, in the case where fluorine radicals are used for removing the damage layer after the etching process, some of the fluorine radicals chemically react with the resist, and the damage layer cannot be fully removed as a result.

In order to solve such a problem, there has been proposed a technique for removing a damage layer, wherein polymers and a resist are removed, first, after the etching process, the object is once placed back to atmosphere, and once again, under a vacuum condition, the damage layer is removed. However, such a technique involves not only a large amount of time, but also a great number of facilities.

Presently, the size of the semiconductor wafer, the object to be processed, is changing from 6 inches to 8 inches, and under such circumstances, the drawbacks described above are delaying the processing time.

SUMMARY OF THE INVENTION

The present invention has been achieved in consideration of such circumstances, and an object thereof is to provide an etching method which can effectively removes polymers and damage layers adhered to a material during the etching step by post-processing step, thereby achieving a high etching producibility, a high through put, and reduction in size of facilities.

Another object is to provide a method of post-etching process which can effectively remove polymers and damage layers adhered to a material during the etching step, thereby achieving a high etching producibility, a high throughput, and reduction in size of facilities.

Still another object is to provide etching equipment which can effectively remove polymers and damage layers adhered to a material during the etching step, thereby achieving a high etching producibility, a high throughput, and reduction in size thereof.

According to the first aspect of the present invention, there is provided an etching method comprising: a main etching step for etching an object to be processed having a resist film serving as an etching mask; a post-processing step for processing the object after the main etching so as to eliminate part of the resist film remaining on the object, a polymer adhered to a surface of the object, and an impurity layer created by the primary etching, said post-processing step including a first step for eliminating the remaining part of the resist layer, and the polymer adhered to the surface of the object by plasma produced from a gas including $O_2$ gas, and a second step for eliminating the impurity layer by plasma made from a gas including halogen-containing gas and $O_2$ gas, after substantially completing the first step.

According to the second aspect of the present invention, there is provided a method of post-etching process carried out on an etched object with a resist film serving as an etching mask, comprising a first step for eliminating remaining part of a resist layer, and a polymer adhered to the surface of an object by plasma produced from a gas including $O_2$ gas, and a second step for eliminating an impurity layer by plasma produced from a gas including halogen-containing gas and $O_2$ gas, after substantially completing the first step.

According to the third aspect of the present invention, there is provided etching equipment comprising: an etching apparatus for main etching an object to be processed having a resist film serving as an etching mask by means of plasma of an etching gas; a post-processing apparatus for performing a plasma process on the object after the main etching with plasma produced from a gas including $O_2$ gas so as to eliminate part of the resist film remaining on the object and a polymer adhered to a surface of the object, and performing a plasma process with plasma made from a gas including a halogen-containing gas and $O_2$ gas so as to eliminate an impurity layer created by the main etching; conveying means for conveying the object from the etching apparatus to the post-processing apparatus; and switching means for switching a processing gas to the gas including the halogen-containing gas and $O_2$ gas after substantially completing the plasma processing by the plasma produced from the gas including $O_2$ gas, in the post-processing apparatus.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 1 is a plan view snowing a brief structure of etching equipment used in the etching process according to the present invention;

DETAILED DESCRIPTION OF THE PREFERRED EMBODIMENTS

Figure 2:
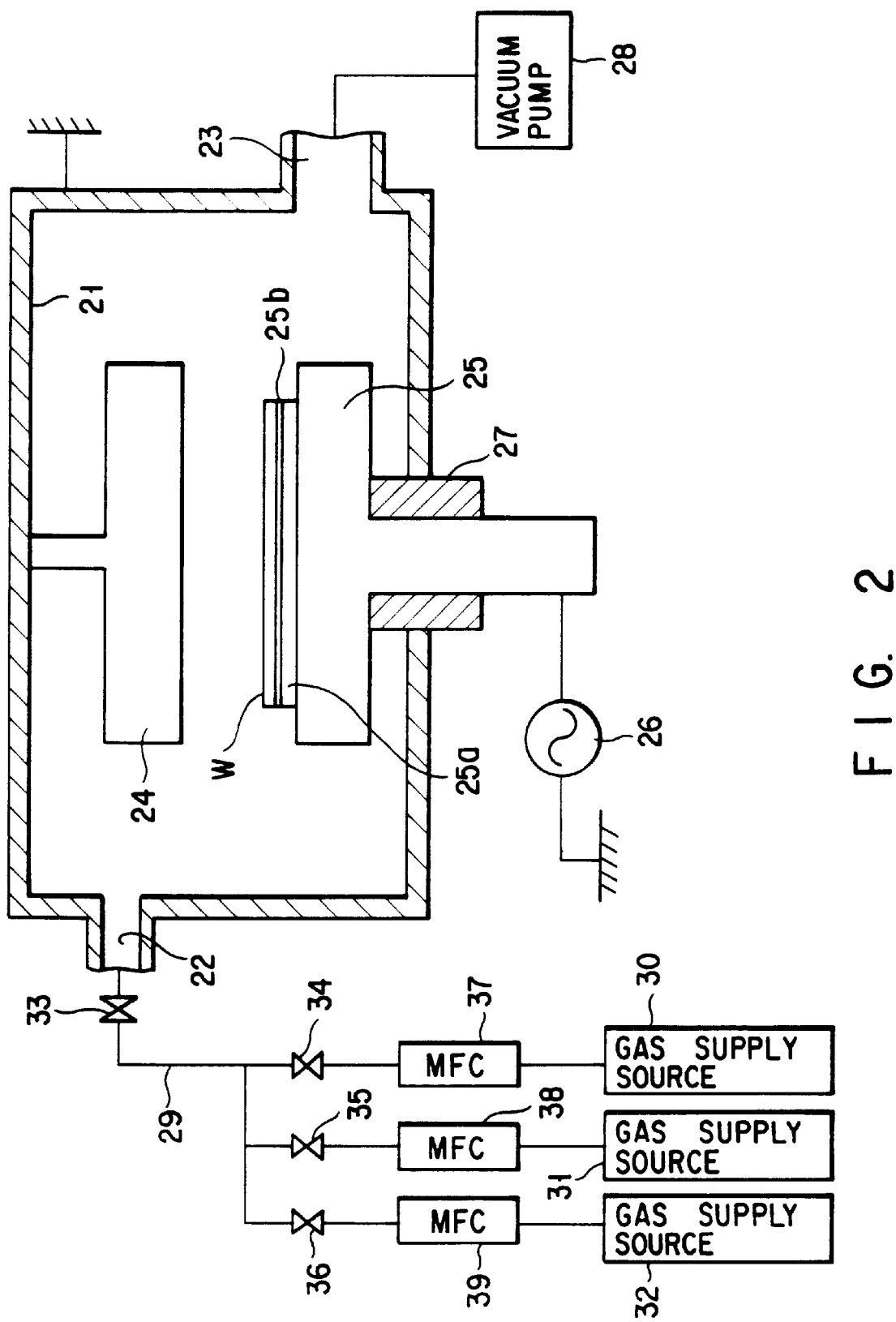
FIG. 2 is a cross sectional view showing the first processing apparatus for the main etching process.

FIG. 1 is a plan view of etching equipment applied to the present invention. The etching equipment include a storage section 1 for storing a wafer cassette 20 which holds a wafer W, a load/unload section 2 for loading/unloading the wafer W to/from the storage section 1 by means of a multi-joint arm 19, an alignment section 3 for aligning the wafer W loaded from the load/unload section 2, a processing section 4 for processing the wafer w aligned by the alignment section 3 under a reduced pressure, and a gas source and power supply unit 5 for supplying gases and electricity to the processing section 4.

The processing section 4 comprises a first processing apparatus 11 for performing the primary etching on a semiconductor water W under a vacuum condition, and a second processing apparatus 12 for carrying out an ashing process and a light etching process as a post-etching process.

The first and second processing apparatuses 11 and 12 are connected, respectively, to the first and second load lock chambers 13 and 14 used for the purpose of shutting off from atmosphere. The third load lock chamber 15 is connected between the first and second processing apparatuses 11 and 12 such as to form a U shape with these members. At the center portion of the U shape, there is provided a delivery stage 17 having a placement stand for temporarily holding a wafer, which can be moved up or down. Further, a gate valve 18 is provided on each of the atmosphere side and the processing chamber side of each of the load lock chambers 13 to 15.

The first processing apparatus 11 includes a processing vessel 21, upper and lower electrodes 24 and 25 provided in the processing vessel 21 such that the surfaces of the electrodes are arranged in horizontal positions and face to each other, and a high-frequency power supply 26.

The processing vessel 21 is designed to etch an object to be processed such as a semiconductor wafer W (to be called as wafer hereinafter) therein, and has a gas supply port 22 at an upper section of its side wall, and a gas exhaust port 23 at a lower section of the side wall. The vessel can be evacuated via the gas exhaustion opening 23 by means of a vacuum pump 28 serving as evacuating means so as to maintain a vacuum state in the vessel, and a processing gas is supplied thereto via the gas supply opening 22.

The upper electrode 24 located on the upper wall side of the processing vessel 21 is grounded via the vessel 21 itself, whereas the lower electrode 25 located on the lower wall side of the vessel 21 is insulated by an insulation member 27 disposed between the lower electrode 25 and the side wall of the processing vessel 21, and connected to the high-frequency power source 26. The lower electrode 25 has a disk-shaped projecting section (susceptor) 25a at the center portion of the upper surface, and a wafer W is held on the susceptor 25a. On the susceptor 25a, there is provided an electrostatic chuck 25b for electrostatically attracting the wafer W, by which the wafer w is held by an attraction force.

Gas supply sources 30, 31 and 32 which supply processing gases for etching into the processing chamber 21 are connected to the gas supply port 22 via a gas supply line 29. The gas supply sources 30, 31 and 32 contain, for example, $CF_4$ gas, $CHF_3$ gas and Ar gas, respectively, which are supplied to the processing vessel 21 at a predetermined ratio. The gas line 29 has a main valve 33 for opening/closing the gas line, valves 34, 35 and 36 respectively corresponding to the gas supply sources, and mass flow controllers 37, 38 and 39 for respectively controlling the flow of the gases, and with these members, the switching of gas and the control of flow can be conducted. It should be noted here that the gases used for the etching process are not limited to those mentioned, but gases used for general etching can be employed.

Figure 3:
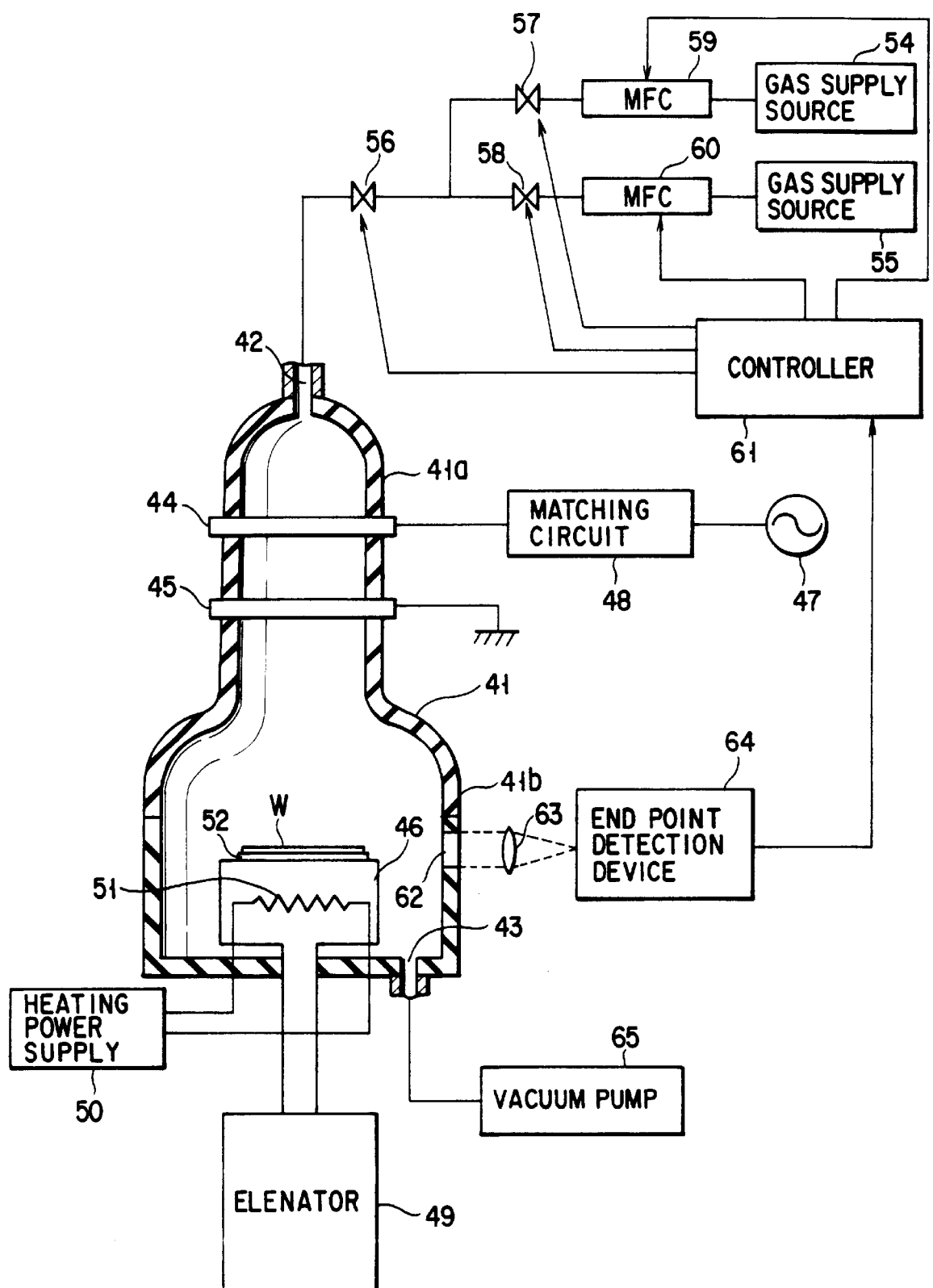
FIG. 3 is a cross sectional view showing the second processing apparatus for the ashing process and the light etching process carried out as a post-etching process.

As can be seen in FIG. 3, the second processing apparatus 12 includes a processing vessel 41, a pair of electrodes 44 and 45 provided at an upper section of the processing vessel 41, a wafer stand 46 provided near the bottom portion within the vessel 41, and a high-frequency power supply 47.

The processing vessel 41 is made of an insulating material such as silica glass, and has an upper section 41a having a small diameter, and a lower section 41b having a large diameter. A gas supply port 42 and a gas exhaust port 43 are provided at top and bottom sections of the vessel, respectively. The pair of electrodes 44 and 45 are wound around the upper section 41a of the processing vessel 41, and the electrode 44 which serves as the upper electrode 44 is connected to the high-frequency power supply 47 via a matching circuit 48. The electrode 45 which serves as the lower electrode is grounded.

The wafer stand 46 can be ascended/descended by an elevator 49, and in the wafer stand, there is provided a heater 51. The heater 51 is connected to a power supply 50, from which electricity is supplied to the heater. An electrostatic chuck 52 is provided on the wafer stand 46, and a wafer W is attracted to the electrostatic chuck.

A gas supply source 54 for supplying a gas containing $O_2$, used for ashing into the processing vessel 41, and a gas supply source 55 for supplying a halogen-containing gas used for light etching into the processing vessel 41 are connected to the gas supply port 42 via a gas line 53. The gas line 53 has a main valve 56 for opening/closing the gas line, valves 57 and 58 respectively corresponding to the gas supply sources, and mass flow controllers 59 and 60 for respectively controlling the flow rate of the gases, and with these members, the switching of gas and the control of flow rate can be conducted. The valves 56, 57 and 58 and the mass controllers 59 and 60 are controlled by a controller 61.

At a position of the side wall of the processing vessel 41, which corresponds to that of the wafer, there is provided a window 62 made of a heat-proof transparent material, for example, silica glass, and the optical information from the wafer W is led to an end point detecting device 64 via a convex lens 63. The end point detection device 64 serves to detect completion of ashing based on -She optical information from the wafer W, and the detected information is output to a control device 61. The control device 61, upon reception of the information, outputs control signals to the valves 57 and 58, and the mass flow controllers 59 and 60 so as to switch the components and the flow of gas supplied into the processing vessel 42 from the ashing use to the light etching use.

The following operation may be used in place of the end point detection device. That is, the ashing rate is calculated in advance, and the value of the rate is programmed in the control device 61. In the ashing step, after a predetermined time calculated from the value, the control device 61 outputs instruction signals to the valves and the mass flow controller for switching the components and the flow rate of gas from the ashing use to the light etching use.

An $O_2$-containing gas is used as an ashing gas. Examples of such a gas are $O_2$ gas itself, and a mixture gas containing $O_2$ gas and an inert gas. In the mixture gas, the supply amount of the $O_2$ gas is preferable 50% or more in terms of the entire gas supplied to the vessel. A preferable example of the inert gas is $N_2$ gas.

A mixture gas including halogen-containing gas and $O_2$ gas is used as a light-etching gas. The halogen containing gas is, preferably, of a fluorine-containing type, and examples thereof are $CF_4$ gas and $SF_6$ gas. A carbon and fluorine containing gas, for example, $CF_4$ is particularly preferable. The type containing other halogens such as Cl and Br may be also used. Similar to the ashing gas, the light-etching gas may contain an inert gas, for example, $N_2$ gas. The supply amount of the halogen-containing gas and $O_2$ gas should be 50% or more of the entire gas supplied to the vessel.

A vacuum pump 65 which serves as exhaust means is connected to the gas exhaust port 43, and thus the processing vessel 41 is evacuated to a predetermined degree of vacuum.

An etching process of a wafer w by use of the above-described etching equipment is conducted in the following manner. First, the wafer w is unloaded from the wafer cassette 20 of the storage section 1 by means of the multi-joint arm 19 of the load/unload section 2, and aligned by the alignment member 3 (alignment of orientation flat). The wafer is, then, delivered to the delivery stage 17 of the processing member 4. Next, the first load lock chamber 13 and the first processing chamber 21 are evacuated in advance to substantially the same degree of vacuum, for example, $1\times10^{-3}$ Torr or less. The gate valve 18 of the first load lock chamber 13 is opened, and the wafer W is loaded from the first load lock chamber 13 into the processing chamber 21 of the processing apparatus 11. After that, the gate valve i8 between zne first load lock chamber 13 and the first processing device 11 is closed.

In the etching process within the first processing apparatus 11, an etching gas, for example, $CF_4+CHF_3+Ar$, is supplied into the processing vessel 21, and the vessel 21 is evacuated to a predetermined degree of vacuum, for example, 300 mTorr. Then, a high-frequency electrical power of, for example, 1300 W is applied between the electrodes 24 and 25, thereby creating plasma of the etching gas in the processing vessel 21. A predetermined portion of the wafer w is thus etched by ions and radicals in the plasma.

The present invention is applicable to an arbitrary object as long as it requires a post-processing etching process such as ashing and light-etching after its etching step, but effective particularly to those having the structure in which an oxide film such as $SiO_2$ or a nitride film such as $Si_3N_4$ is formed on a silicon substrate.

For example, the wafer W has the structure in which a $SiO_2$ film 71 is formed as an oxide film on the surface of a silicon substrate 70, and a photoresist layer 72 is further formed on the $SiO_2$ film 71. An example of the etching process of such a wafer W will be described.

Figure 4A:
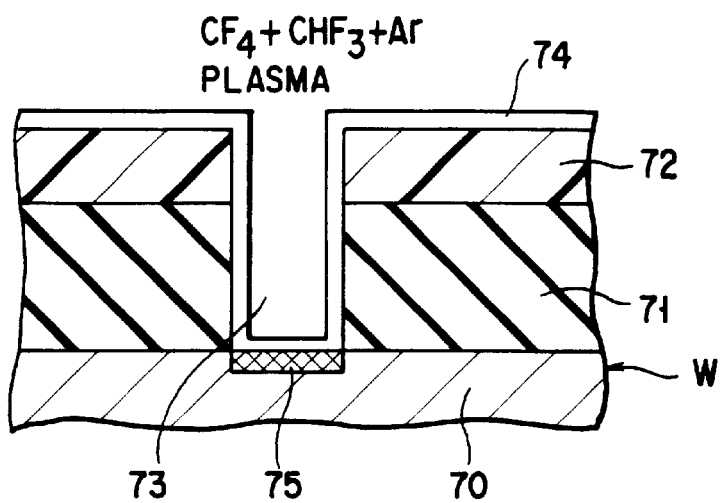
FIGS. 4A to 4C are explanatory diagrams illustrating the concept of the etching process according to the present invention.

An etching pattern of the wafer W is formed, for example, as shown in FIG. 4A. As can be seen in this figure, a mask is formed by photoetching on part of the photoresist layer 72 and other part of the layer which is not masked is etched to make an etching hole 73 serving as, for example, a contact hole.

The thickness of the oxide film ($SiO_2$ film) is, for example, about 1 to 2 $\mu$m. In the case where the wafer w is of the 4M type, the diameter of the contact hole is, for example, about 0.4 to 0.8 $\mu$m, whereas the case where it is of the 16M type, the diameter is about 0.2 to 0.4 $\mu$m.

As mentioned before, when a mixture gas containing a fluorine-based gas and a fluorine-hydrogen-based gas, for example, $CF_4+CHF_3+Ar$, is used as an etching gas, the efficiency of the etching process can be enhanced, and a fine process becomes possible. However, at the same time, a polymer 74 formed of C—H during the etching process is formed on the wafer surface due to the presence of hydrogen (H), and an impurity is mixed into the bottom portion of the etching hole 73, the surface layer of the Si substrate 70, forming a damage layer 75. The polymer 74 not only delays the finishing time of the ashing process (rag time) in the second processing apparatus 12, but also is likely to degrade the reproducibility of the etching.

Figure 4B:
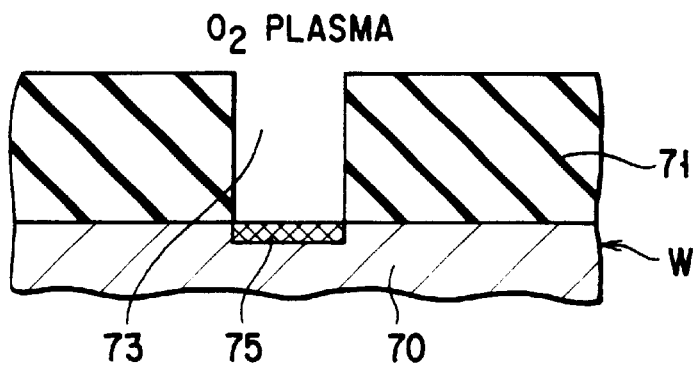

In the present invention, after the etching process, the wafer W is loaded into the processing vessel 41 of the second processing apparatus 12 through the third load lock chamber 15, and an ashing process and a light etching process are carried out in the vessel. In this operation, the pressure in the processing vessel is reduced to, for example, 1 Torr, and the temperature of the wafer stand 46 in the processing vessel 41 is raised to about 250° C. by the heater. Then, $O_2$ gas, i.e. processing gas for ashing, is supplied at a flow of 3000 SCCM, and a high-frequency power of, for example, 700 W is applied to make the processing gas into plasma. Thus, as shown in FIG. 4B, the polymer 74 formed of C—H and the photoresist layer 72 are removed. It should be noted here that the ashing time should preferably be 2 to 3 minutes, and the pressure in the processing vessel should fall with a range of 1 to 3 Torr.

Figure 4C:
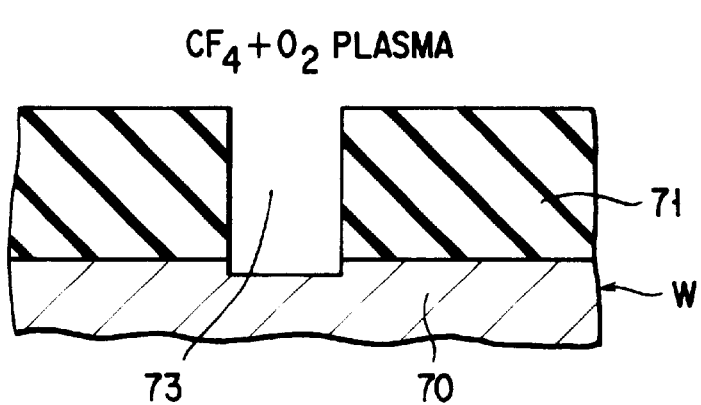

When the ashing process is substantially completed, only the processing gas is switched to the light etching gas, namely, a mixture gas of $CF_4$ and $O_2$, and the light etching gas supplied into the processing vessel 41 is made into plasma, by which the wafer W is lightly etched. Thus, the damage layer 75 adhered to the bottom of the etching hole 73 is removed as shown in FIG. 4C. The light etching time is preferably within 1.5 minutes.

As described, according to the present invention, a wafer, which was etched, is placed in an atmosphere of 250° C., and plasma produced from an ashing gas containing $O_2$ is supplied to the wafer W. After the photo-resist layer 72 and the polymer 74 are removed by the plasma, the processing gas is switched to the light etching gas, i.e. a mixture of a halogen-containing gas and $O_2$ gas, for example, $CF_4+O_2$ and at the same high temperature condition as in the ashing process, plasma produced from this light etching gas is supplied to the wafer W so as to remove the damage layer 75 adhered onto the bottom portion of the etching hole 73. In short, the ashing process and the light etching process, which are carried out after the main etching process, are conducted in the same processing vessel 41 of the second processing apparatus 12. Further, the damage layer 75 is removed after elimination of the polymer 74 and the photoresist layer 72. Therefore, the processing time can be shortened and the size of facilities can be reduced. The damage layer 75 is removed after elimination of the polymer 74 and the photoresist layer 72, and therefore the damage layer 75 can be surely removed.

The present invention and the conventional ashing process were compared with each other in the following manner. In both cases, the amount of $SiO_2$ scraped off from the $SiO_2$ layer in the lateral direction (the diameter of an etching hole at completion of the main etching—the diameter of the same after the light etching) was measured at the center position, the intermediate position, and the edge position of the wafer. In the conventional ashing process, the scraped amount was no more than 800 angstrom at the center and intermediate positions, whereas it was 1200 angstrom at the edge position with the post-etching process or the present invention, the scraped amount was about the same, i.e. 1000 angstrom or less, at the center, intermediate, and edge positions, indicating that a post-etching process with far less variation than that of the conventional technique could be conducted.

Further, after the photoresist layer 72 and the polymer 74 were eliminated in the ashing process, the light etching process was carried out under the conditions, atmospheric pressure: 1 Torr; high-frequency power between electrodes: 80 watts; flow rate of $CF_4$: 490 SCCM; flow rate Of $O_2$: 210 SCCM; and temperature of atmosphere: 250° C. The result indicated that the damage layer 75 could be removed in the entire region of the wafer W.

Lastly, apart from the etching apparatus, and the ashing/light etching apparatus described above, a variety of apparatuses can be used in the present invention.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. Etching equipment comprising:

an etching apparatus for main etching an object having a resist film as an etching mask with a plasma produced by an etching gas;

a post-processing apparatus for removing a resist film remaining on the object after the main etching step, a polymer deposited on the surface of the object, and a damage layer formed by the main etching treatment; and transfer means for transferring the object from the etching apparatus to the post-processing apparatus, wherein:

the post-processing apparatus includes a processing chamber, first gas supply means for supplying an $O_2$ gas or a mixture of an $O_2$ gas and an inert gas into the processing chamber, second gas supply means for supplying a halogen-containing gas or a mixture of a halogen-containing gas and an inert gas into the processing chamber, and switching means for switching supply by the first gas supply means to a gas supply by the second gas supply means;

the object, after the main etching treatment, is treated with a plasma treatment produced by the gas supply by the first gas supply means and consisting essentially of an $O_2$ gas or a mixture of an $O_2$ and an inert gas so as to remove a resist film remaining on the object and a polymer deposited on the surface of the object; and after substantially completing the plasma treatment, the gas supply through the first and second gas supply means is switched by the switching means to perform a plasma treatment with a plasma produced by a gas mixture consisting essentially of a halogen-containing gas and an $O_2$ gas or a halogen-containing gas, an $O_2$ gas, and an inert gas so as to remove an impurity layer formed by the main etching.

2. The equipment according to claim 1, wherein said switching means includes an end point detection device for detecting completion of the plasma process by means of plasma produced from the gas including $O_2$ gas in said post-processing apparatus, and performs switching of gas in accordance with an instruction from said end point detection device.

* * * * *